(12) United States Patent
Sawamura et al.

(10) Patent No.: US 10,010,979 B2
(45) Date of Patent: Jul. 3, 2018

(54) SOLDER PASTE FOR BONDING MICRO COMPONENTS

(71) Applicant: Nihon Almit Co., Ltd., Tokyo (JP)

(72) Inventors: Tadashi Sawamura, Tokyo (JP); Takeo Igarashi, Tokyo (JP); Yukio Maeda, Tokyo (JP); Kazuhiko Kaneko, Tokyo (JP)

(73) Assignee: Nihon Almit Co., Ltd., Tokyo (JP)

( * ) Notice: Subject to any disclaimer, the term of this patent is extended or adjusted under 35 U.S.C. 154(b) by 501 days.

(21) Appl. No.: 13/905,821

(22) Filed: May 30, 2013

(65) Prior Publication Data

US 2013/0327444 A1 Dec. 12, 2013

(30) Foreign Application Priority Data

Jun. 8, 2012 (JP) .................. 2012-130491

(51) Int. Cl.
| | | |
|---|---|---|
| *C22C 13/00* | (2006.01) | |
| *B23K 35/02* | (2006.01) | |
| *B23K 35/26* | (2006.01) | |
| *H05K 3/34* | (2006.01) | |
| *C22C 13/02* | (2006.01) | |

(52) U.S. Cl.
CPC .......... *B23K 35/025* (2013.01); *B23K 35/262* (2013.01); *C22C 13/00* (2013.01); *C22C 13/02* (2013.01); *H05K 3/3463* (2013.01); *H05K 3/3484* (2013.01)

(58) Field of Classification Search
CPC ..................................... C22C 13/00
USPC .......................................... 148/24
See application file for complete search history.

(56) References Cited

U.S. PATENT DOCUMENTS

| | | | | |
|---|---|---|---|---|
| 5,985,212 A | * | 11/1999 | Hwang ............... | B23K 35/262 148/400 |
| 2002/0066583 A1 | * | 6/2002 | Soga ................... | B23K 35/262 174/50.56 |
| 2007/0071634 A1 | * | 3/2007 | Huang .................... | C22C 13/00 420/560 |
| 2010/0307823 A1 | * | 12/2010 | Kawamata ............ | B23K 35/26 174/84 R |
| 2011/0120769 A1 | * | 5/2011 | Sakatani ............. | B23K 35/262 174/84 R |
| 2012/0175020 A1 | * | 7/2012 | Imamura .............. | B23K 35/025 148/24 |

FOREIGN PATENT DOCUMENTS

| | | | | |
|---|---|---|---|---|
| EP | 1333957 B1 | * | 4/2005 | .......... B23K 35/262 |
| JP | 3021996 | | 1/2000 | |
| JP | 3027441 | | 1/2000 | |
| JP | 2000190090 A | * | 7/2000 | |
| JP | 2004188453 A | * | 7/2004 | |

\* cited by examiner

*Primary Examiner* — Christopher Kessler
(74) *Attorney, Agent, or Firm* — McHale & Slavin, P.A.

(57) ABSTRACT

A solder paste for soldering micro components which suppress electro-migration is provided. The solder paste comprising: a powdered Pb-free soldering alloy comprising Cu of 0.1~3.0 wt. % and In of 0.5~8.0 wt. % simultaneously in addition to Sn; and a pasty or liquid flux; the powdered Pb-free soldering alloy and the pasty or liquid flux being mixed; whereby effectively suppressing electro-migration occurring at a solder bonding portion. It is possible to add Ag, Sb, Ni, Co, Fe, Mn and Cr as a strength improvement element, Bi and Zn as a melting point drop element and P, Ga and Ge as an anti-oxidant element to the powdered Pb-free soldering alloy.

7 Claims, No Drawings

SOLDER PASTE FOR BONDING MICRO COMPONENTS

BACKGROUND OF THE INVENTION

Technical Field

The present invention relates to a solder paste for bonding micro components, which suppresses electro migration.

Background Art

So far a soldering alloy of Sn—Ag—Cu or Sn—Cu has been widely used which was proposed in Japanese patent No. 3027441 as so called Pb-free soldering alloy that is almost without Pb.

When soldering a micro component to a print circuit a reflow soldering method which uses a pasty soldering paste that is prepared by mixing a powdered soldering alloy and a pasty or liquid flux is widely adopted.

Electro-migration is a phenomenon where at a metal wiring portion or a solder bonding portion, diffusion of metal atoms occurs by an interaction between metal atoms and electrons running in the wired portion and metal atoms migrate toward a direction of an electric current. It is a well known fact that electro-migration occurs notably when a current density is high.

In the field of semiconductors refinement of wiring has been pursued due to rapid expansion of semiconductor demands. This caused occurrence of electro-migration through high current density in a metal wiring to make disconnection of the metal wiring, which became a major issue.

A solution for a disconnection of Aluminum wiring was proposed in a Japanese patent No. 3021996 which teaches a use of Aluminum wiring with uniformly added Scandium, whereby preventing an occurrence of electro-migration.

Meanwhile a possibility of occurrence of electro-migration at a solder bonding portion has been regarded as small as its area is larger than that of a metal wiring used in semiconductor field. However, the area of a solder bonding portion has become considerably smaller together with refinement of a circuit board and components on it and emergence of reflow soldering method as a main stream of soldering.

For example, a chip capacitor and a chip resistor are soldered through reflow soldering method using a solder paste. Recently sizes of a chip capacitors and a chip resistor are refined remarkably and models such as '0603' with length of 0.6 mm and width of 0.3 mm, and '0402' with length of 0.4 mm and width of 0.2 mm are widely used. Further, a model of '0201' with length of 0.2 mm and width of 0.1 mm is now under development.

Under these circumstances where increased current density together with decreased area of a solder bonding portion is anticipated an occurrence of electro-migration at a solder bonding portion is concerned. When electro-migration occurs at a solder bonding portion there is a possibility that the soldering alloy would have a crack and an exfoliation and as a result electrical disconnection would occur. The disconnection at the solder bonding portion would cause a malfunction of an electronic device and may result in a fatal accident.

DISCLOSURE OF INVENTION

Recently the solder bonding portion has been refined along with the refinement of circuit boards and as a result an occurrence of electro-migration at a solder bonding portion due to high current density is concerned.

Therefore an object of present invention is to provide a Pb-free solder paste which suppresses an occurrence of electro-migration at a solder bonding portion.

In order to fulfill the above object, present invention provides a solder paste for bonding micro components comprising:

a powdered Pb-free soldering alloy comprising Cu of 0.1~3.0 wt. %, In of 0.5~8.0 wt. %, Sn and unavoidable impurities of the rest; and a pasty or liquid flux;

the powdered Pb-free soldering alloy and the pasty or liquid flux being mixed;

whereby effectively suppressing electro-migration occurring at a solder bonding portion.

The soldering alloy used in the present invention comprises Cu of 0.1 to 3.0 wt. %, In of 0.5 to 8.0 wt. % and Sn and unavoidable impurities of the balance. When either Cu or In alone is added to the alloy, the effectiveness of suppressing the occurrence of electro-migration at the solder bonding portion is low. However when both of Cu and In are added at a certain wt. %, the occurrence of electro-migration at the solder bonding portion is effectively suppressed.

The mechanism of suppressing the occurrence of electro-migration has not been elucidated yet. However it is known that in a soldering alloy Cu makes a Sn—Cu (Cu6Sn5) inter-metallic compound and In forms a SnIn solid solution wherein Sn dissolves.

Electro-migration is a phenomenon where a diffusion of metal atoms occurs by an interaction between metal atoms and electrons running in a wiring portion at a solder bonding portion and metal atoms migrate toward a direction of electric current. Therefore it is reasonable to consider that especially when the current density is high, Sn—Cu inter-metallic compounds and SnIn solid solution with which the soldering alloy is dotted, may suppress the movement of metal atoms with considerable effectiveness.

When both of Cu and In are added to the soldering alloy and added amount of Cu is equal to or less than 0.1 wt. % or added amount of In is equal to or less than 0.5 wt. % the effectiveness of suppressing the occurrence of electro-migration is low. Also when both of Cu and In are added to the soldering alloy and the amount of Cu is more than 3.0 wt. %, a liquidus temperature of the soldering alloy may go higher and liquidity of the soldering alloy may be reduced and as a result its solderability may be deteriorated. Therefore this composition of Cu with more than 3.0 wt. % is inadequate for a soldering alloy. Also when both of Cu and In are added to the soldering alloy and the amount of In is more than 8.0 wt. %, the liquidus temperature of the soldering alloy may be lowered considerably and the soldering alloy at a solder bonding portion may partly melt in case it is exposed to a high temperature. In addition, as In is high priced recently it not adequate to include In excessively.

A soldering alloy comprising Cu of 0.1 to 3.0 wt. % and In of 0.5 to 8.0 wt. % in addition to Sn effectively prevents an occurrence of electro-migration at a solder bonding portion. However its strength is not enough when considerably high strength is required to the solder bonding portion. In such cases it is possible to add either one or more elements of Ag, Sb, Ni, Co, Fe, Mn, Cr as an element for improving mechanical characteristics and strength of the solder bonding portion. These metallic elements have an effect of improving mechanical characteristics through forming a solid solution or an inter-metallic compound with the main component Sn. However an excessive amount of these may raise the liquidus temperature. Therefore it is preferable that the amount of Ag and/or Sb is not more than 4.0 wt. % and the total amount of Ni, Co, Fe, Mn and Cr is not more than 0.3 wt. % respectively.

When it is necessary to lower the reflow soldering temperature, for example to prevent thermal degradation of electronic components mounted on a printed circuit board, it is possible to add either one or both of Bi, Zn as a melting point drop element. However when the amount of Bi is excessive brittleness of the soldering alloy may increase. Also when the amount of Zn is excessive the soldering alloy may be oxidized at the time of melting and as a result its solderability is deteriorated. Therefore it is preferable that the amount of Bi and/or Zn is not more than 3.0 wt. %.

Further, it is possible to add either one or more of P, Ga and Ge as an anti-oxidant element to prevent oxidization of the soldering alloy at the time of reflow soldering. However when the amount of these is excessive the brittleness of the soldering alloy may increase and its solderability may be deteriorated. Therefore it is preferable that the total amount of P, Ga and Ge is not more than 0.3 wt. %.

MODE FOR CARRYING OUT THE INVENTION

The present invention will be described below based on embodiments.

Pb-free soldering alloy powder (average grain size of 20~30 micrometer) with compositions described in the Table 1 and Table 2 which include both Cu and In in addition to Sn is prepared. Then the soldering alloy powder of 90 wt. % and a pasty flux of 10 wt. % are mixed to form a solder paste.

The solder paste was print-painted on a circuit board for mounting chip components using a mask for painting. Then a test chip component (a Nickel plated Cupper plate with 3.2 mm in length, 1.6 mm in width, 0.6 mm in thickness) was mounted on the painted portion. Then the circuit board was heated in a reflow oven and the solder paste was melt to form soldering between the test chip and the circuit board. After soldering was finished, the circuit board was left in an environment of 120 degree C. and a current of 10 A was imposed on the solder bonding portion. After 100 hours a cross section of the solder bonding portion was examined to detect occurrence of electro-migration. The test result was as shown in Table 3.

TABLE 1

Composition of powdered Pb free solder alloy

Weight %

| | Sn | Cu | In | Ag | Sb | Ni | Co | Mn | Fe | Cr |
|---|---|---|---|---|---|---|---|---|---|---|
| Example 1 | the rest | 0.1 | 0.5 | | | | | | | |
| Example 2 | the rest | 0.7 | 0.5 | | | | | | | |
| Example 3 | the rest | 0.7 | 5.0 | | | | | | | |
| Example 4 | the rest | 3.0 | 5.0 | | | | | | | |
| Example 5 | the rest | 0.7 | 8.0 | | | | | | | |
| Example 6 | the rest | 0.7 | 0.5 | 0.3 | | | | | | |
| Example 7 | the rest | 3.0 | 8.0 | 1.0 | | | | | | |
| Example 8 | the rest | 0.1 | 0.5 | 1.0 | | | | | | |
| Example 9 | the rest | 0.5 | 3.0 | 3.0 | | | | | | |
| Example 10 | the rest | 0.7 | 3.0 | 4.0 | | | | | | |
| Example 11 | the rest | 0.1 | 3.0 | | 0.5 | | | | | |
| Example 12 | the rest | 3.0 | 8.0 | | 4.0 | | | | | |
| Example 13 | the rest | 0.7 | 0.5 | 1.0 | 0.5 | | | | | |
| Example 14 | the rest | 0.1 | 8.0 | 3.0 | 3.0 | | | | | |
| Example 15 | the rest | 0.7 | 0.5 | | | 0.1 | | | | |
| Example 16 | the rest | 3.0 | 0.5 | | | 0.2 | | | | |
| Example 17 | the rest | 0.7 | 8.0 | | | 0.1 | | | | |
| Example 18 | the rest | 0.1 | 0.5 | | | | 0.1 | | | |
| Example 19 | the rest | 3.0 | 8.0 | | | | 0.2 | | | |

TABLE 1-continued

Composition of powdered Pb free solder alloy

Weight %

| | Sn | Cu | In | Ag | Sb | Ni | Co | Mn | Fe | Cr |
|---|---|---|---|---|---|---|---|---|---|---|
| Example 20 | the rest | 0.7 | 3.0 | | | | 0.1 | | | |
| Example 21 | the rest | 0.1 | 3.0 | | | | | 0.1 | | |
| Example 22 | the rest | 3.0 | 8.0 | | | | | 0.2 | | |
| Example 23 | the rest | 0.7 | 0.5 | | | | | | 0.05 | |
| Example 24 | the rest | 0.1 | 0.5 | | | | | | 0.05 | |
| Example 25 | the rest | 0.7 | 3.0 | | | | | | 0.05 | |
| Example 26 | the rest | 3.0 | 8.0 | | | | | | 0.2 | |
| Example 27 | the rest | 0.1 | 3.0 | | | | | | | 0.05 |
| Example 28 | the rest | 3.0 | 8.0 | | | | | | | 0.2 |
| Example 29 | the rest | 0.7 | 0.5 | | | 0.1 | 0.1 | | | |
| Example 30 | the rest | 0.1 | 3.0 | | | 0.1 | 0.1 | 0.1 | | |
| Example 31 | the rest | 3.0 | 8.0 | | | 0.1 | 0.2 | | | |
| Example 32 | the rest | 0.7 | 3.0 | | | 0.1 | 0.1 | | 0.05 | |
| Example 33 | the rest | 3.0 | 3.0 | | | 0.1 | 0.1 | | 0.05 | 0.05 |
| Example 34 | the rest | 0.7 | 0.5 | | | 0.1 | | | 0.05 | |
| Example 35 | the rest | 0.7 | 0.5 | | | | 0.2 | | 0.05 | 0.05 |
| Example 36 | the rest | 0.7 | 0.5 | 0.3 | | 0.1 | | | | |
| Example 37 | the rest | 3.0 | 0.5 | 1.0 | | 0.2 | | | | |
| Example 38 | the rest | 0.5 | 8.0 | 3.0 | | 0.1 | | | | |
| Example 39 | the rest | 0.1 | 0.5 | 0.3 | | | 0.1 | | | |
| Example 40 | the rest | 3.0 | 8.0 | 1.0 | | | 0.2 | | | |
| Example 41 | the rest | 0.5 | 3.0 | 3.0 | | | 0.1 | | | |
| Example 42 | the rest | 0.1 | 3.0 | 3.0 | | | | 0.1 | | |
| Example 43 | the rest | 3.0 | 8.0 | 3.0 | | | | 0.2 | | |
| Example 44 | the rest | 0.7 | 0.5 | 0.3 | | | | | 0.05 | |
| Example 45 | the rest | 0.1 | 0.5 | 1.0 | | | | | 0.05 | |
| Example 46 | the rest | 0.5 | 3.0 | 3.0 | | | | | 0.05 | |
| Example 47 | the rest | 3.0 | 8.0 | 4.0 | | | | | 0.2 | |
| Example 48 | the rest | 0.1 | 3.0 | 3.0 | | | | | | 0.05 |
| Example 49 | the rest | 3.0 | 8.0 | 4.0 | | | | | | 0.2 |
| Example 50 | the rest | 0.7 | 0.5 | 0.3 | | 0.1 | 0.1 | | | |
| Example 51 | the rest | 0.5 | 3.0 | 3.0 | | 0.1 | 0.1 | 0.1 | | |
| Example 52 | the rest | 0.7 | 8.0 | 4.0 | | 0.1 | 0.2 | | | |
| Example 53 | the rest | 0.7 | 3.0 | 4.0 | | 0.1 | 0.1 | | 0.05 | |
| Example 54 | the rest | 0.7 | 3.0 | 4.0 | 0.5 | 0.1 | 0.1 | | 0.05 | 0.05 |
| Example 55 | the rest | 0.5 | 0.5 | 3.0 | | 0.1 | | | 0.05 | |
| Example 56 | the rest | 0.5 | 0.5 | 3.0 | | 0.2 | | 0.05 | | 0.05 |
| Comparative Example 1 | the rest | 0.7 | | | | | | | | |
| Comparative Example 2 | the rest | 3.0 | | | | | | | | |
| Comparative Example 3 | the rest | | 0.5 | | | | | | | |
| Comparative Example 4 | the rest | | 8.0 | | | | | | | |
| Comparative Example 5 | the rest | 0.7 | | 0.3 | | | | | | |
| Comparative Example 6 | the rest | 0.7 | | 1.0 | | | | | | |
| Comparative Example 7 | the rest | 0.5 | | 3.0 | | | | | | |

TABLE 2

Composition of powdered Pb free solder alloy

Weight %

| | Sn | Cu | In | Ag | Sb | Bi | Zn | P | Ga | Ge |
|---|---|---|---|---|---|---|---|---|---|---|
| Exmaple 57 | the rest | 0.7 | 0.5 | | | 0.5 | | | | |
| Exmaple 58 | the rest | 0.1 | 3.0 | | | 0.5 | | | | |
| Exmaple 59 | the rest | 0.7 | 8.0 | | | 0.5 | | | | |
| Exmaple 60 | the rest | 0.7 | 0.5 | | | 1.0 | | | | |
| Exmaple 61 | the rest | 0.7 | 3.0 | | | 3.0 | | | | |
| Exmaple 62 | the rest | 3.0 | 3.0 | | | 3.0 | | | | |
| Exmaple 63 | the rest | 0.1 | 3.0 | | | | 1.0 | | | |
| Exmaple 64 | the rest | 3.0 | 8.0 | | | | 3.0 | | | |
| Exmaple 65 | the rest | 0.7 | 0.5 | | | 1.0 | 1.0 | | | |
| Exmaple 66 | the rest | 3.0 | 8.0 | | | | | 0.1 | | |
| Exmaple 67 | the rest | 0.1 | 0.5 | | | | | | 0.1 | |

TABLE 2-continued

Composition of powdered Pb free solder alloy

Weight %

| | Sn | Cu | In | Ag | Sb | Bi | Zn | P | Ga | Ge |
|---|---|---|---|---|---|---|---|---|---|---|
| Exmaple 68 | the rest | 0.7 | 0.5 | | | | | | | 0.1 |
| Exmaple 69 | the rest | 0.7 | 3.0 | | | | | | | 0.1 |
| Exmaple 70 | the rest | 0.7 | 3.0 | | | | | 0.1 | 0.1 | |
| Exmaple 71 | the rest | 3.0 | 0.5 | | | | | 0.1 | 0.1 | 0.1 |
| Exmaple 72 | the rest | 0.7 | 0.5 | | | 3.0 | | | | 0.1 |
| Exmaple 73 | the rest | 0.7 | 3.0 | | | 3.0 | | | | 0.1 |
| Exmaple 74 | the rest | 0.7 | 3.0 | | | | 3.0 | | 0.1 | 0.1 |
| Exmaple 75 | the rest | 0.7 | 0.5 | 0.3 | | 0.5 | | | | |
| Exmaple 76 | the rest | 0.1 | 3.0 | 1.0 | | 0.5 | | | | |
| Exmaple 77 | the rest | 0.7 | 8.0 | 3.0 | | 0.5 | | | | |
| Exmaple 78 | the rest | 0.5 | 0.5 | 3.0 | | 1.0 | | | | |
| Exmaple 79 | the rest | 0.5 | 3.0 | 3.0 | | 3.0 | | | | |
| Exmaple 80 | the rest | 0.7 | 3.0 | 4.0 | | 3.0 | | | | |
| Exmaple 81 | the rest | 0.5 | 0.5 | 3.0 | | | 1.0 | | | |
| Exmaple 82 | the rest | 3.0 | 8.0 | 0.3 | | | 3.0 | | | |
| Exmaple 83 | the rest | 0.5 | 0.5 | 3.0 | 0.5 | 1.0 | 1.0 | | | |
| Exmaple 84 | the rest | 3.0 | 8.0 | 0.3 | | | | 0.1 | | |
| Exmaple 85 | the rest | 0.5 | 0.5 | 3.0 | | | | | 0.1 | |
| Exmaple 86 | the rest | 0.7 | 0.5 | 0.3 | | | | | | 0.1 |
| Exmaple 87 | the rest | 0.5 | 3.0 | | | | | | | 0.1 |
| Exmaple 88 | the rest | 0.1 | 3.0 | 3.0 | | | | 0.1 | 0.1 | |
| Exmaple 89 | the rest | 3.0 | 0.5 | 3.0 | | | | 0.1 | 0.1 | 0.1 |
| Exmaple 90 | the rest | 0.7 | 0.5 | 0.3 | | 3.0 | | | | 0.1 |
| Exmaple 91 | the rest | 0.5 | 3.0 | 3.0 | | 3.0 | | | | 0.1 |
| Exmaple 92 | the rest | 0.5 | 3.0 | 3.0 | 0.5 | | 3.0 | | 0.1 | 0.1 |
| Comparative Example 8 | the rest | | | | | 58.0 | | | | |
| Comparative Example 9 | the rest | | | | | | 9.0 | | | |

TABLE 3

Test Results of Electro-migration

Occurence of electro-migration at the solder bonding portion

| Example 1 | No occurrence (intermetallic compound layer at positive pole: | 2.6 μm) |
|---|---|---|
| Example 2 | No occurrence (intermetallic compound layer at positive pole: | 2.5 μm) |
| Example 3 | No occurrence (intermetallic compound layer at positive pole: | 2.5 μm) |
| Example 4 | No occurrence (intermetallic compound layer at positive pole: | 2.3 μm) |
| Example 5 | No occurrence (intermetallic compound layer at positive pole: | 2.7 μm) |
| Example 6 | No occurrence (intermetallic compound layer at positive pole: | 3.0 μm) |
| Example 7 | No occurrence (intermetallic compound layer at positive pole: | 2.5 μm) |
| Example 8 | No occurrence (intermetallic compound layer at positive pole: | 2.4 μm) |
| Example 9 | No occurrence (intermetallic compound layer at positive pole: | 2.5 μm) |
| Example 10 | No occurrence (intermetallic compound layer at positive pole: | 3.1 μm) |
| Example 11 | No occurrence (intermetallic compound layer at positive pole: | 2.2 μm) |
| Example 12 | No occurrence (intermetallic compound layer at positive pole: | 2.4 μm) |
| Example 13 | No occurrence (intermetallic compound layer at positive pole: | 2.2 μm) |
| Example 14 | No occurrence (intermetallic compound layer at positive pole: | 2.7 μm) |
| Example 15 | No occurrence (intermetallic compound layer at positive pole: | 2.2 μm) |
| Example 16 | No occurrence (intermetallic compound layer at positive pole: | 2.6 μm) |
| Example 17 | No occurrence (intermetallic compound layer at positive pole: | 2.5 μm) |
| Example 18 | No occurrence (intermetallic compound layer at positive pole: | 2.5 μm) |
| Example 19 | No occurrence (intermetallic compound layer at positive pole: | 3.2 μm) |
| Example 20 | No occurrence (intermetallic compound layer at positive pole: | 2.8 μm) |
| Example 21 | No occurrence (intermetallic compound layer at positive pole: | 3.3 μm) |
| Example 22 | No occurrence (intermetallic compound layer at positive pole: | 3.0 μm) |
| Example 23 | No occurrence (intermetallic compound layer at positive pole: | 2.6 μm) |
| Example 24 | No occurrence (intermetallic compound layer at positive pole: | 2.3 μm) |
| Example 25 | No occurrence (intermetallic compound layer at positive pole: | 2.4 μm) |
| Example 26 | No occurrence (intermetallic compound layer at positive pole: | 3.1 μm) |
| Example 27 | No occurrence (intermetallic compound layer at positive pole: | 2.8 μm) |
| Example 28 | No occurrence (intermetallic compound layer at positive pole: | 3.0 μm) |
| Example 29 | No occurrence (intermetallic compound layer at positive pole: | 2.5 μm) |
| Example 30 | No occurrence (intermetallic compound layer at positive pole: | 2.7 μm) |
| Example 31 | No occurrence (intermetallic compound layer at positive pole: | 2.3 μm) |
| Example 32 | No occurrence (intermetallic compound layer at positive pole: | 2.4 μm) |
| Example 33 | No occurrence (intermetallic compound layer at positive pole: | 2.9 μm) |
| Example 34 | No occurrence (intermetallic compound layer at positive pole: | 2.4 μm) |
| Example 35 | No occurrence (intermetallic compound layer at positive pole: | 3.0 μm) |
| Example 36 | No occurrence (intermetallic compound layer at positive pole: | 2.4 μm) |
| Example 37 | No occurrence (intermetallic compound layer at positive pole: | 3.0 μm) |
| Example 38 | No occurrence (intermetallic compound layer at positive pole: | 2.7 μm) |
| Example 39 | No occurrence (intermetallic compound layer at positive pole: | 2.8 μm) |
| Example 40 | No occurrence (intermetallic compound layer at positive pole: | 2.4 μm) |
| Example 41 | No occurrence (intermetallic compound layer at positive pole: | 3.0 μm) |
| Example 42 | No occurrence (intermetallic compound layer at positive pole: | 3.0 μm) |
| Example 43 | No occurrence (intermetallic compound layer at positive pole: | 3.1 μm) |
| Example 44 | No occurrence (intermetallic compound layer at positive pole: | 2.5 μm) |
| Example 45 | No occurrence (intermetallic compound layer at positive pole: | 2.7 μm) |
| Example 46 | No occurrence (intermetallic compound layer at positive pole: | 2.3 μm) |
| Example 47 | No occurrence (intermetallic compound layer at positive pole: | 2.6 μm) |
| Example 48 | No occurrence (intermetallic compound layer at positive pole: | 2.5 μm) |
| Example 49 | No occurrence (intermetallic compound layer at positive pole: | 2.5 μm) |
| Example 50 | No occurrence (intermetallic compound layer at positive pole: | 3.2 μm) |
| Example 51 | No occurrence (intermetallic compound layer at positive pole: | 2.6 μm) |
| Example 52 | No occurrence (intermetallic compound layer at positive pole: | 3.1 μm) |
| Example 53 | No occurrence (intermetallic compound layer at positive pole: | 2.2 μm) |
| Example 54 | No occurrence (intermetallic compound layer at positive pole: | 2.7 μm) |

TABLE 3-continued

Test Results of Electro-migration

Occurence of electro-migration at the solder bonding portion

| | | |
|---|---|---|
| Example 55 | No occurrence (intermetallic compound layer at positive pole: | 2.6 μm) |
| Example 56 | No occurrence (intermetallic compound layer at positive pole: | 2.7 μm) |
| Example 57 | No occurrence (intermetallic compound layer at positive pole: | 2.4 μm) |
| Example 58 | No occurrence (intermetallic compound layer at positive pole: | 2.0 μm) |
| Example 59 | No occurrence (intermetallic compound layer at positive pole: | 3.2 μm) |
| Example 60 | No occurrence (intermetallic compound layer at positive pole: | 3.3 μm) |
| Example 61 | No occurrence (intermetallic compound layer at positive pole: | 3.1 μm) |
| Example 62 | No occurrence (intermetallic compound layer at positive pole: | 3.0 μm) |
| Example 63 | No occurrence (intermetallic compound layer at positive pole: | 2.7 μm) |
| Example 64 | No occurrence (intermetallic compound layer at positive pole: | 2.8 μm) |
| Example 65 | No occurrence (intermetallic compound layer at positive pole: | 2.4 μm) |
| Example 66 | No occurrence (intermetallic compound layer at positive pole: | 2.5 μm) |
| Example 67 | No occurrence (intermetallic compound layer at positive pole: | 2.9 μm) |
| Example 68 | No occurrence (intermetallic compound layer at positive pole: | 3.1 μm) |
| Example 69 | No occurrence (intermetallic compound layer at positive pole: | 2.6 μm) |
| Example 70 | No occurrence (intermetallic compound layer at positive pole: | 2.3 μm) |
| Example 71 | No occurrence (intermetallic compound layer at positive pole: | 2.7 μm) |
| Example 72 | No occurrence (intermetallic compound layer at positive pole: | 2.6 μm) |
| Example 73 | No occurrence (intermetallic compound layer at positive pole: | 2.3 μm) |
| Example 74 | No occurrence (intermetallic compound layer at positive pole: | 2.3 μm) |
| Example 75 | No occurrence (intermetallic compound layer at positive pole: | 3.0 μm) |
| Example 76 | No occurrence (intermetallic compound layer at positive pole: | 2.9 μm) |
| Example 77 | No occurrence (intermetallic compound layer at positive pole: | 2.3 μm) |
| Example 78 | No occurrence (intermetallic compound layer at positive pole: | 2.4 μm) |
| Example 79 | No occurrence (intermetallic compound layer at positive pole: | 2.6 μm) |
| Example 80 | No occurrence (intermetallic compound layer at positive pole: | 2.7 μm) |
| Example 81 | No occurrence (intermetallic compound layer at positive pole: | 3.0 μm) |
| Example 82 | No occurrence (intermetallic compound layer at positive pole: | 2.7 μm) |
| Example 83 | No occurrence (intermetallic compound layer at positive pole: | 2.6 μm) |
| Example 84 | No occurrence (intermetallic compound layer at positive pole: | 2.6 μm) |
| Example 85 | No occurrence (intermetallic compound layer at positive pole: | 2.9 μm) |
| Example 86 | No occurrence (intermetallic compound layer at positive pole: | 3.0 μm) |
| Example 87 | No occurrence (intermetallic compound layer at positive pole: | 2.9 μm) |
| Example 88 | No occurrence (intermetallic compound layer at positive pole: | 2.7 μm) |
| Example 89 | No occurrence (intermetallic compound layer at positive pole: | 2.6 μm) |
| Example 90 | No occurrence (intermetallic compound layer at positive pole: | 2.8 μm) |
| Example 91 | No occurrence (intermetallic compound layer at positive pole: | 2.7 μm) |
| Example 92 | No occurrence (intermetallic compound layer at positive pole: | 2.6 μm) |
| Comparative Example 1 | Occurrence (intermetallic compound layer at positive pole: | 100 μm) |
| Comparative Example 2 | Occurrence (intermetallic compound layer at positive pole: | 80 μm) |
| Comparative Example 3 | Occurrence (intermetallic compound layer at positive pole: | 110 μm) |
| Comparative Example 4 | Occurrence (intermetallic compound layer at positive pole: | 70 μm) |
| Comparative Example 5 | Occurrence (intermetallic compound layer at positive pole: | 90 μm) |
| Comparative Example 6 | Occurrence (intermetallic compound layer at positive pole: | 85 μm) |
| Comparative Example 7 | Occurrence (intermetallic compound layer at positive pole: | 90 μm) |
| Comparative Example 8 | Occurrence (intermetallic compound layer at positive pole: | 50 μm) |
| Comparative Example 9 | Occurrence (intermetallic compound layer at positive pole: | 85 μm) |

Pb-free soldering alloy powder which includes either Cu or In alone in addition to Sn was prepared. Then the soldering alloy powder of 90 wt. % and a pasty flux of 10 wt. % were mixed to form a solder paste. Using the solder paste the test chip and the circuit board were soldered. Electro-migration tests at respective solder bonding portions found out occurrences of electro-migration there. In that solder bonding portion, an unusually thick inter-metallic compound layer (50~100 micro meter in thickness) was formed on the positive pole side which cannot be found in normal solder bonding portions. Meanwhile on the negative pole side a phenomenon of a partial loss of Copper wiring on the circuit board was confirmed. These phenomena may be deduced that due to very high current density (estimated value of 20 kA/cm$^2$) on the solder bonding portion, a diffusion of atoms which normally never occurs has occurred and metallic atoms moved toward the positive pole to which electric current flows. Based on this we concluded that the electro-migration has occurred at the solder bonding portion.

On the other hand a Pb-free soldering alloy powder which includes both Cu of 0.1~3.0 wt. % and In of 0.5~8.0 wt. % simultaneously in addition to Sn was prepared. Then the soldering alloy powder of 90 wt. % and pasty flux of 10 wt. % were mixed to form a solder paste. Using the solder paste the test chip and the circuit board were soldered. Electro-migration tests at solder bonding portions found out that the thickness of an inter-metallic compound layer at respective solder bonding portions was less than 10 micro meters and that the occurrence of electro-migration was not confirmed.

Further, a Pb-free soldering alloy powder which includes both Cu of 0.1~3.0 wt. % and In of 0.5~8.0 wt. % simultaneously in addition to Sn and also includes either one of 1) Ag, Sb, Ni, Co, Fe, Mn, Cr as a strength improvement element, 2) Bi, Zn as a melting point drop element and 3) P, Ga and Ge as an anti-oxidant element was prepared respectively. Then the respective soldering alloy powder of 90 wt. % and pasty flux of 10 wt. % were mixed to form a respective solder paste. Using the respective solder paste a test chip and a circuit board were soldered. Electro-migration tests on solder bonding portions found out that a thickness of an inter-metallic compound layer at respective solder bonding portions using the respective solder pastes was less than 10 micro meters and that the occurrence of electro-migration was not confirmed.

Based on above experimental results it is found out that the soldering paste for soldering micro components of present invention which is a mixture of a powdered Pb-free soldering alloy comprising Cu of 0.1~3.0 wt. % and In of 0.5~8.0 wt. % simultaneously in addition to Sn; and a pasty flux; effectively suppresses electro-migration occurring at a solder bonding portion, and thereby provides a reliable and high quality Pb-free solder bonding portion even when an area of the solder bonding portion will become smaller due to progressive refinement of a mount board.

The present invention is applicable not only to a reflow soldering method but also to various kinds of soldering methods such as a flow soldering method, a dip soldering method, a laser soldering method, an ultrasonic soldering method, a friction soldering method and a manual soldering method using a resin flux cored solder, where an occurrence of electro-migration is anticipated due to a small area of a solder bonding portion.

What is claimed is:

1. A solder paste for bonding micro components comprising:
    a powdered Ag-free soldering alloy consisting of Cu of 2.6 to 3.0 wt. %, In of 6.5 to 8.0 wt. %, Sn and unavoidable impurities of the rest; and
    a paste or liquid flux;
    the powdered Ag-free soldering alloy and the paste or liquid flux being mixed;
    whereby effectively suppressing electro-migration occurring at a solder bonding portion.

2. A solder paste for bonding micro components comprising:
    a powdered Pb-free soldering alloy consisting of Cu of 2.6 to 3.0 wt. %, In of 6.5 to 8.0 wt. %, Ag and/or Sb of equal to or less than 4.0 wt. % as a strength improvement element, Sn and unavoidable impurities of the rest; and
    a paste or liquid flux;
    the powdered Pb-free soldering alloy and the paste or liquid flux being mixed;
    whereby effectively suppressing the electro-migration occurring at the solder bonding portion.

3. A solder paste for bonding micro components comprising:
    a powdered Ag-free soldering alloy consisting of Cu of 2.6 to 3.0 wt. %, In of 6.5 to 8.0 wt. %, one or more elements selected from a group of Ni, Co, Fe, Mn and Cr of equal to or less than 0.3 wt. % in total as a strength improvement element, Sn and unavoidable impurities of the rest; and
    a paste or liquid flux;
    the powdered Ag-free soldering alloy and the paste or liquid flux being mixed;
    whereby effectively suppressing the electro-migration occurring at the solder bonding portion.

4. A solder paste for bonding micro components comprising:
    a powdered Ag-free soldering alloy consisting of Cu of 2.6 to 3.0 wt. %, In of 6.5 to 8.0 wt. %, Bi and/or Zn of equal to or less than 3.0 wt. % as a melting point drop element, Sn and unavoidable impurities of the rest; and
    a paste or liquid flux;
    the powdered Ag-free soldering alloy and the paste or liquid flux being mixed;
    whereby effectively suppressing the electro-migration occurring at the solder bonding portion.

5. A solder paste for bonding micro components comprising:
    a powdered Ag-free soldering alloy consisting of Cu of 2.6 to 3.0 wt. %, In of 6.5 to 8.0 wt. %, one or more elements selected from a group of P, Ga and Ge of equal to or less than 0.3 wt. % in total as an anti-oxidant element, Sn and unavoidable impurities of the rest; and
    a paste or liquid flux;
    the powdered Ag-free soldering alloy and the paste or liquid flux being mixed;
    whereby effectively suppressing the electro-migration occurring at the solder bonding portion.

6. A solder paste for bonding micro components comprising:
    a powdered Pb-free soldering alloy consisting of Cu of 2.6 to 3.0 wt. %, In of 6.5 to 8.0 wt. %, Ag and/or Sb of equal to or less than 4.0 wt. % as a strength improvement element, one or more elements selected from a group of Ni, Co, Fe, Mn and Cr of equal to or less than 0.3 wt. % in total as a strength improvement element, Sn and unavoidable impurities of the rest; and
    a paste or liquid flux;
    the powdered Pb-free soldering alloy and the paste or liquid flux being mixed;
    whereby effectively suppressing the electro-migration occurring at the solder bonding portion.

7. A solder paste for bonding micro components comprising:
    a powdered Pb-free soldering alloy consisting of Cu of 2.6 to 3.0 wt. %, In of 6.5 to 8.0 wt. %, Ag and/or Sb of equal to or less than 4.0 wt. % as a strength improvement element, one or more elements selected from a group of P, Ga and Ge of equal to or less than 0.3 wt. % in total as an anti-oxidant element, Sn and unavoidable impurities of the rest; and
    a paste or liquid flux;
    the powdered Pb-free soldering alloy and the paste or liquid flux being mixed;
    whereby effectively suppressing the electro-migration occurring at the solder bonding portion.

* * * * *